United States Patent
Lin et al.

(10) Patent No.: US 8,956,911 B2
(45) Date of Patent: Feb. 17, 2015

(54) LED PHOSPHOR AND FABRICATING METHOD THEREOF

(71) Applicant: National Taiwan University, Taipei (TW)

(72) Inventors: Ching-Fuh Lin, Taipei (TW); Ming-Shiun Lin, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/728,888

(22) Filed: Dec. 27, 2012

(65) Prior Publication Data

US 2014/0014911 A1  Jan. 16, 2014

(30) Foreign Application Priority Data

Jul. 13, 2012 (TW) .............................. 101125445 A

(51) Int. Cl.
| | |
|---|---|
| *H01L 21/20* | (2006.01) |
| *H01L 33/00* | (2010.01) |
| *C23C 14/32* | (2006.01) |
| *H01L 51/50* | (2006.01) |
| *H01L 51/56* | (2006.01) |

(52) U.S. Cl.
CPC ............ *H01L 51/5036* (2013.01); *H01L 51/56* (2013.01); *Y02B 20/181* (2013.01)
USPC ............. 438/104; 438/458; 438/478; 257/40; 257/43; 257/615; 257/E21.09; 257/E21.211

(58) Field of Classification Search
USPC ................. 257/40, 43, 615, E21.09, E21.211; 438/104, 458, 478
See application file for complete search history.

(56) References Cited

U.S. PATENT DOCUMENTS

| | | | |
|---|---|---|---|
| 2009/0267479 A1* | 10/2009 | Hutchison et al. | ............ 313/309 |
| 2010/0101939 A1* | 4/2010 | Ho et al. | ................. 204/192.15 |
| 2010/0133527 A1* | 6/2010 | Lin et al. | .......................... 257/43 |
| 2011/0012505 A1* | 1/2011 | Lin et al. | ....................... 313/504 |
| 2011/0065236 A1* | 3/2011 | Lin et al. | ....................... 438/104 |

FOREIGN PATENT DOCUMENTS

TW  201105163 A  2/2011

OTHER PUBLICATIONS

Lin et al. "ZnO Nanorods on PMMA for White-Light Emission Using UV-Ozone Treatment" International Conference on Nanoscience +Technology 2012, Meeting No. 296, Paris, France, Jul. 23-27, 2012.
Office Action Dated Jul. 25, 2014 in corresponding Taiwan Patent Application No. 101125445.

* cited by examiner

*Primary Examiner* — Dao H Nguyen
(74) *Attorney, Agent, or Firm* — Donald E. Stout; Stout, Uxa & Buyan, LLP

(57) ABSTRACT

The present invention relates to a LED (light-emitting diode) phosphor and fabricating method thereof, and particularly relates to a LED phosphor having a light-emitting thin film (or photoluminescence thin film) made of an organic material and a zinc oxide microstructure (or nanostructure) and a method for fabricating the LED phosphor by hydrothermal method and combination of the organic material and the zinc oxide microstructure (or nanostructure). In this invention, the light-emitting thin film (or photoluminescence thin film) made of the organic material and the zinc oxide microstructure (or nanostructure) is applied instead of rare earth elements to fabricate the LED phosphor. Therefore, the cost of the LED phosphor and the white LED can be reduced and the processes for fabricating the LED phosphor and the white LED can be simplified.

38 Claims, 3 Drawing Sheets

LED PHOSPHOR AND FABRICATING METHOD THEREOF

CROSS-REFERENCE TO RELATED APPLICATIONS

This application claims the benefit of Taiwan Patent Application No. 101125445, filed on Jul. 13, 2012, the disclosure of which is incorporated herein in its entirety by reference.

BACKGROUND OF THE INVENTION

1. Field of the Invention

The present invention relates to a LED (light-emitting diode) phosphor and fabricating method thereof, and particularly relates to a LED phosphor having a light-emitting thin film (or photoluminescence thin film) made of an organic material and a zinc oxide microstructure (or nanostructure), a method for fabricating this LED phosphor by hydrothermal method and combination of the organic material and the zinc oxide microstructure (or nanostructure), and a method of photoluminescence employing this LED phosphor to emit white light.

2. Description of Related Art

As the requirement of energy saving and environmental consciousness are increased, the white light emitting diode (white LED) is employed instead of the conventional white light bulb and tube gradually. Now, the white LED is fabricated by following three methods: (1) A multi-chip LED or RGB LED is formed by combining a red LED, a green LED and a blue LED. The multi-chip LED (or RGB LED) emits white light by mixing the red light emitted from the red LED, the green light emitted from the green LED, and the blue light emitted from the blue LED. (2) A blue LED is used to emit a blue light. The yellow phosphor, such as YAG($Y_3Al_5O_2$), coated on a epoxy resin is excited by a portion of the blue light to emit a yellow light. Another portion of the blue is mixed with the yellow light to emit a white light. (3) A purple LED is used to excite a red phosphor, a green phosphor, and a blue phosphor to emit a red light, a green light, and a blue light respectively. The red light, the green light, and the blue light are mixed to generate a white light.

However, all of the foregoing methods have shortcomings. In the method (1), it has a need of different driving circuits to drive different LED chips because the RGB LED is composed of different LED chips. The process of fabricating the RGB LED becomes complicated due to these driving circuits, and the multi-chip LED (or RGB LED) has bad heat dissipation. Therefore, the method (1) has disadvantages of complicated fabricating process and bad heat dissipation.

In the method (2), most raw materials of the phosphor are rare earth elements. The yield of rare earth elements is few and it is difficult to mine the rare earth elements. Thus, the prices of the rare earth elements are high and still rising, and the costs of the phosphor and the white LED are increasing. Furthermore, the surface vegetation of the earth is broken when rare earth elements are mined. It results in a serious environmental disruption. The phosphor is usually fabricated by solid-state sintering. In the solid-state sintering process, the raw material of the phosphor need to be sintered at the temperature over 1000° C. for a long period of time, and thus the cost of fabricating the phosphor is increased. Therefore, the method (2) has disadvantages of increasing cost and environmental disruption caused by employing the rare earth elements and the solid-state sintering.

Similar to the method (2), the method (3) also has disadvantages of increasing cost and environmental disruption because it has a need of employing the red phosphor, the green phosphor, and the blue phosphor in the method (3). Furthermore, the method (3) has another disadvantage that it is difficult to mix the red phosphor, the green phosphor, and the blue phosphor with each other. Generally, the process of the method (1) is too complicated so that most of the present white LEDs are fabricated by the methods (2) and (3). Therefore, the phosphor is indispensable to the white LED. Accordingly, the problems of high production cost of the white LED caused by the phosphor and the environmental disruption caused by mining the rare earth elements cannot be resolved.

Therefore, it has a need of a fabricating method of a LED (light-emitting diode) phosphor. In this method, other material, which is cheap, easy to be obtained, and environmentally friendly, is used instead of the rare earth elements to be the raw material of the phosphor, and the phosphor is fabricated with simple process, simple processing conditions (or requirements) and low cost. Moreover, the cost of producing a white LED can be decreased and the process of producing a white LED can be simplified by employing this phosphor to produce a white LED.

SUMMARY OF THE INVENTION

In view of the foregoing, one object of the present invention is to provide a fabricating method of a LED (light-emitting diode) phosphor. In this method, material, which is cheap, easy to be obtained, and environmentally friendly, is used instead of the rare earth elements to be the raw material of the phosphor, and the process having advantages of simple process, simple processing conditions (or requirements) and low cost is applied instead of the conventional solid-state sintering having a need of high cost, long processing time, and high temperature for fabricating the LED phosphor. Therefore, the cost of fabricating the LED phosphor can be decreased and the process for fabricating the LED phosphor can be simplified. Furthermore, the LED phosphor fabricated by this method can be applied to fabricate a white LED. Therefore, the cost of producing a white LED can be decreased and the process of producing a white LED can be simplified by using this LED phosphor.

Another object of the present invention is to provide a LED phosphor. In this LED phosphor, a light-emitting thin film (or photoluminescence thin film) made of an organic material and a zinc oxide microstructure (or nanostructure) which are cheap, easy to be obtained, and environmentally friendly, is used instead of the rare earth elements, which are expensive and not environmentally friendly to be the raw material of the phosphor. Furthermore, this LED phosphor can be applied to produce a white LED.

According to one of the objects above, a fabricating method of a LED phosphor is disclosed herein. The method comprises following steps: (1) providing a substrate; (2) forming an organic thin film on the substrate; (3) performing a surface bond scission treatment to the organic thin film; and (4) forming a zinc oxide micro/nano structure on the organic thin film. By interactions between the organic thin film and the zinc oxide micro/nano structure, there are many dangling bonds in an interface between the organic thin film and the zinc oxide micro/nano structure, and lots of surface energy levels are created in the interface. Therefore, the interface between the organic thin film and the zinc oxide micro/nano structure can be excited by a purple light (with wavelength of 300 nm to 390 nm) to emit a yellow-green light (with wavelength of 500 nm to 600 nm). So the phosphor fabricate by this method of the present invention can be a phosphor used in a LED. The cost of fabricating the LED phosphor can be decreased and the process for fabricating the LED phosphor can be simplified because the organic thin film and the zinc oxide micro/nano structure are cheaper and easier to be obtained than rare earth elements and the processes of fabricating the organic thin film and the zinc oxide micro/nano structure are simple. Furthermore, the cost of fabricating a white LED can be decreased and the process for fabricating the white LED can be simplified by this method.

According to one of the objects above, a fabricating method of a LED phosphor is disclosed herein. The method comprises following steps: (1) providing a substrate; and (2) forming a photoluminescence thin film on the substrate wherein the photoluminescence thin film comprises a blue light organic material and a zinc oxide micro/nano structure. In the LED phosphor fabricated by this method, the blue light organic material in the photoluminescence thin film can be excited by a purple light (with wavelength of 300 nm to 390 nm) to emit a blue light, and an interface between the blue light organic material and the zinc oxide micro/nano structure can be excited by a purple light (with wavelength of 300 nm to 390 nm) to emit a yellow-green light. Therefore, the photoluminescence thin film can be a LED phosphor, which can emit the blue light and the yellow-green light simultaneously by the purple light and a white light can be formed by mixing the blue light and the yellow-green light directly. The cost of fabricating the LED phosphor can be decreased and the process for fabricating the LED phosphor can be simplified because the blue light organic material and the zinc oxide micro/nano structure are cheaper and easier to be obtained than rare earth elements and the processes of fabricating the blue light organic material and the zinc oxide micro/nano structure are simple. Furthermore, the cost of fabricating a white LED can be decreased and the process for fabricating the white LED can be simplified by this method.

According to another one of the objects above, a LED phosphor is disclosed herein. The LED phosphor comprises a substrate and a photoluminescence thin film deposed on the substrate wherein the photoluminescence thin film comprises an organic material and a zinc oxide micro/nano structure. This LED phosphor has no need of rare earth elements and it can be excited by a purple light to emit a yellow-green light or to emit a blue light and a yellow-green light simultaneously. The cost of fabricating the LED phosphor can be decreased because the organic material and the zinc oxide micro/nano structure, which are used to form the photoluminescence thin film, are cheaper and easier to be obtained than rare earth elements. Furthermore, the cost of fabricating a white LED can be decreased by using this LED phosphor.

Therefore, the present invention provides a fabricating method of a LED phosphor. In this method, material, which is cheap, easy to be obtained, and environmentally friendly, is used instead of the rare earth elements to be the raw material of the phosphor, and the process having advantages of simple process, simple processing conditions (or requirements) and low cost is applied instead of the conventional solid-state sintering having a need of high cost, long processing time, and high temperature for fabricating the LED phosphor. Therefore, the cost of fabricating the LED phosphor can be decreased and the process for fabricating the LED phosphor can be simplified. Furthermore, the LED phosphor fabricated by this method can be applied to fabricate a white LED. Therefore, the cost of producing a white LED can be decreased significantly and the process of producing a white LED can be simplified by using this LED phosphor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The detailed description of the present invention will be discussed in the following embodiments, which are not intended to limit the scope of the present invention, and can be adapted for other applications. While drawings are illustrated in detail, it is appreciated that the quantity of the disclosed components may be greater or less than that disclosed, except where expressly restricting the amount of the components. Although specific embodiments have been illustrated and described, it will be appreciated by those skilled in the art that various modifications may be made without departing from the scope of the present invention, which is intended to be limited solely by the appended claims.

Figure 1A:
FIG. 1A to FIG. 1E are a series of cross-section drawings illustrating a fabricating method of a LED phosphor in accordance with an embodiment of the present invention.

FIG. 1A to FIG. 1E show a fabricating method of a LED phosphor in accordance with an embodiment of the present invention, and they are a series of cross-section drawings illustrating the process of this method and different steps of this method. Referring to FIG. 1A, first, a substrate 100 is provided wherein the substrate 100 is a glass substrate, an epoxy substrate, a quartz substrate, a PET substrate, or a substrate which does not react with an organic thin film (or organic material). After, the substrate 100 is washed respectively by deionized water, acetone, methanol, and isopropanol, and then, the substrate 100 is dried by blowing with a nitrogen spray gun. After, a UV-Ozone treatment is performed to the substrate 100 for removing the organic materials on the substrate 100. Therefore, the surface of the substrate 100 becomes a super-clean surface by this treatment. The number of times of washing the substrate 100, the time of washing the substrate 100, and the time of performing UV-Ozone treatment to the substrate 100 can be reduced or increased according to requirements so they are not limited herein in this invention.

Figure 1B:
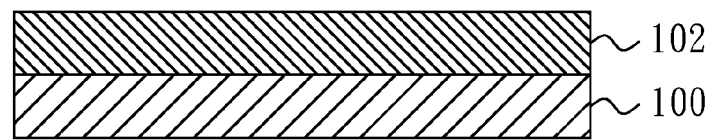
Figure 1C:
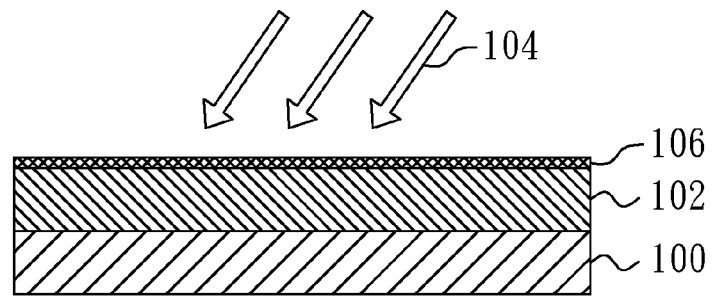

And then, referring to FIG. 1B, a thin film 102 is formed the substrate 100. The thin film 102 is made of gallium nitride (GaN), zinc oxide (ZnO), poly(3-hexylthiophene) (P3HT), poly(3-octylthiophene) (P3OT), poly(N-vinylcarbazole) (PVK), poly(methyl methacrylate) (PMMA), or poly(styrene). The thin film 102 is coated or formed on the substrate 100 by spin coating, dip coating, ink printing, thermal evaporation, sputtering, spray coating, or roll-to-roll. These methods are common and well-known for everyone, and they are not the major features of this invention. Therefore, these methods are detailed herein. After, the thin film 102 formed by above-mentioned organic materials is baked at 100° C. or over 100° C., for example 100° C.-150° C., for removing the remaining organic solvent or remaining organic material from the thin film 102, but it is not limited to this. The baking temperature and the baking time can be determined according to desired process time and damage of the thin film 102 caused by the baking process. Even in one embodiment of this invention, the baking process can be omitted. The thickness of the thin film 102 is 10 nm to 200 μm, but it is not limited to this. The thickness of the thin film 102 can be increased or reduced according to requirements.

And then, referring to FIG. 10, a surface bond scission treatment 104 is performed to the thin film 102 for breaking the chemical bondings of the thin film 102 to form high reactive radicals. By these high reactive radicals, there are many charged functional groups or hydrophilic functional groups generated on the surface 106 of the thin film 102, for example —OH, —COOH, and so on. By these functional groups, the thin film 102 can bond and be compatible with a zinc oxide thin film which is formed in following process (or step) and is used as a seed layer. Therefore, the zinc oxide thin film (the seed layer) having good quality and integrity can be formed on the thin film 102. If the surface bond scission treatment 104 is not performed to the thin film 102, the thin film 102 cannot bond and be compatible with the (inorganic) seed layer and the (inorganic) seed layer (the zinc oxide thin film) having good quality and integrity cannot be formed on the thin film 102. Therefore, it has a bad influence on growth and formation of a zinc oxide micro/nano structure in following process (or step), and the zinc oxide micro/nano structure cannot be formed on the thin film 102.

The surface bond scission treatment 104 is a surface plasma treatment or a UV-Ozone treatment. The process time of the surface bond scission treatment 104 is determined according to what material is used to form the thin film 102. It means that the surface bond scission treatment 104 is performed to the thin film 102 made of different materials with different process time respectively. However, in general, the process time of the surface bond scission treatment 104 is 30 seconds to 5 hours. The longer the process time of the surface bond scission treatment 104 is, the more the charged functional groups or hydrophilic functional groups are generated on the surface 106 of the thin film 102. Therefore, the zinc oxide thin film (the seed layer) will be formed and distributed more uniformly on the thin film 102 without generation of island structures in following process (or step). However, the charged functional groups or hydrophilic functional groups, for example —OH, —COOH, and so on, generated on the thin film 102 will be broken if the process time of the surface bond scission treatment 104 is too long. It causes that the thin film 102 cannot bond with the zinc oxide thin film which is formed in following process (or step) and used as the seed layer.

Taking the thin film 102 made of poly(methyl methacrylate) (PMMA) for example, many charged functional groups or hydrophilic functional groups, such as —OH, —COOH, etc., are generated on the surface 106 of the thin film 102 after the surface bond scission treatment 104 (the surface plasma treatment or the UV-Ozone treatment) is performed to the surface 106 of the thin film 102 for 10 minutes to 60 minutes. In this embodiment, the longer the process time of the surface bond scission treatment 104 is, the more the charged functional groups or hydrophilic functional groups are generated on the surface 106 of the thin film 102. Therefore, the thin film 102 bonds with the zinc oxide seed layer (or the zinc oxide thin film), which is formed in following process, much well, and the zinc oxide seed layer (or the zinc oxide thin film), which is formed in following process, can be distributed on the thin film 102 more uniformly. However, when the surface bond scission treatment 104 is performed to the surface 106 of the thin film 102 over 60 minutes, the foregoing effect is reduced with increasing process time of the surface bond scission treatment 104. When the surface bond scission treatment 104 is performed to the surface 106 of the thin film 102 for 120 minutes to 180 minutes, the charged functional groups or hydrophilic functional groups are generated on the surface 106 of the thin film 102 are broken by the surface bond scission treatment 104. Therefore, the bonding between the thin film 102 and the zinc oxide seed layer (or the zinc oxide thin film), which is formed in following process, is getting worse, and the zinc oxide seed layer (or the zinc oxide thin film), which is formed in following process, cannot be formed on the thin film 102.

Figure 1D:
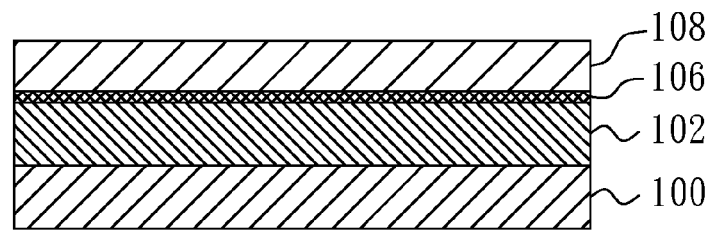

After, referring to FIG. 1D, a zinc oxide thin film 108 is formed on the thin film 102 as a seed layer for growing a zinc oxide micro/nano structure. The zinc oxide thin film 108 is formed on the thin film 102 by solution method. By the charged functional groups or the hydrophilic functional groups, such as —OH, —COOH, etc., which are generated on the surface 106 of the thin film 102 by the surface bond scission treatment 104, the zinc oxide thin film 108 bonds with the thin film 102 very well. Therefore, a uniform, good, and integral zinc oxide thin film 108 can be formed on the thin film 102.

The process of forming the zinc oxide thin film 108 comprises following steps: First, isopropanol is used as a solvent to mix monoethanolamine and isopropanol uniformly to form a mixed solution of monoethanolamine and isopropanol, and then, zinc acetate is added into the mixed solution of monoethanolamine and isopropanol (the molar ratio of zinc acetate and monoethanolamine is maintained at 1:1) for preparing a chemical solution which the solution method is performed by this chemical solution. After, the chemical solution is coated on the thin film 102 by spin coating, and then, it is baked for drying (it is baked at 100° C. for 1 hour, but not limited to this). Therefore, a uniform, good, and integral zinc oxide thin film 108 is formed as the seed layer on the thin film 102.

Figure 1E:
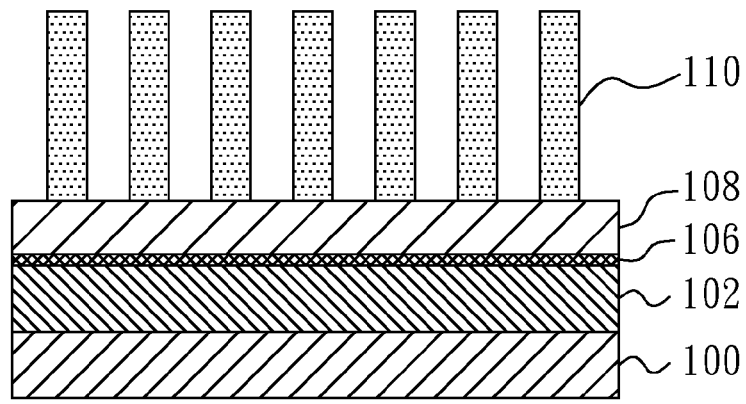

Finally, referring to FIG. 1E, the zinc oxide thin film 108 is used as a seed layer to form or grow a zinc oxide micro/nano structure 110 on the zinc oxide thin film 102. This step is performed by hydrothermal method, spin coating, dip coating, electrochemical method, thermal evaporation, chemical vapor deposition, molecular beam epitaxy, or AAO for forming the zinc oxide micro/nano structure 110 on the zinc oxide thin film 108. Although the step can be performed by different methods mentioned above to form the zinc oxide micro/nano structure 110, the hydrothermal method is a better choice. It is because the hydrothermal method has advantages of simple process, low cost, and uncritical process conditions (or requirements) (the process conditions have no need of high temperature, high pressure, vacuum, etc.).

The step of forming the zinc oxide micro/nano structure 110 by the hydrothermal method comprises following steps: First, zinc nitrate, hexamethylenetetramine, and deionized water are mixed for preparing a zinc nitrate/hexamethylenetetramine aqueous solution, or a mixed aqueous solution, in which zinc oxide is precipitated through chemical reaction, is prepared. The zinc nitrate/hexamethylenetetramine aqueous solution or the mixed aqueous solution is used as a chemical solution (it means a zinc oxide growth solution) of hydrothermal method. The concentration of the chemical solution (or the zinc oxide growth solution) is 50 mM to 220 mM. Next, the substrate 100 (the thin film 102 and the zinc oxide thin film 108 are formed on the substrate 100) is put or dipped into the chemical solution (or the zinc oxide growth solution) at 60° C. to 120° C. for growing the zinc oxide micro/nano structure 110 until the zinc oxide micro/nano structure 110 with desired size is formed or grown. The process time of the hydrothermal method (dipping into the chemical solution) is determined according to the kind and size of the zinc oxide micro/nano structure desired to be formed. Therefore, the present invention does not limit the process time of the hydrothermal method herein. After, the zinc oxide micro/nano structure 110 is washed with deionized water, and then, it is dried by blowing with nitrogen gas. Although how to form the zinc oxide micro/nano structure 110 by hydrothermal method is described in this invention, how to form the zinc oxide micro/nano structure 110 by other methods is not described herein. However, the other methods mentioned above are well known so they are not detailed herein.

The zinc oxide micro/nano structure 110 may be a regular micro/nano structure or an irregular micro/nano structure. Next, the zinc oxide micro/nano structure 110 is a zinc oxide micro/nano rod or a zinc oxide micro/nano line, and the length of the zinc oxide micro/nano structure 110 is 10 nm to 220 μm.

The LED phosphor, which is fabricated by the method illustrated in FIG. 1A-FIG. 1E, has a photoluminescence thin film composed of the thin film 102 and the zinc oxide micro/nano structure 110. The photoluminescence thin film is a multi-layered structure, wherein there are many interface situations in the interfaces between the thin film 102 and the zinc oxide micro/nano structure 110. Therefore, there are many hole traps formed in the interfaces and there are many dangling bonds formed in the interfaces by the cross-linking effect between the thin film 102 and the zinc oxide micro/nano structure 110. It causes that many energy levels are formed in the interfaces. Therefore, the LED phosphor (or the photoluminescence thin film) can be excited by a purple light (with wavelength of 300 nm to 390 nm) to emit a yellow-green light (with wavelength of 500 nm to 600 nm). The LED phosphor is a yellow-green LED phosphor.

The (yellow-green) LED phosphor can be integrated with a purple LED and a blue LED to form a white LED. The (yellow-green) LED phosphor is excited by a purple light emitted from the purple LED to emit a yellow-green light. The yellow-green light emitted from the (yellow-green) LED phosphor is mixed with a blue light emitted from the blue LED to form a white light. In the LED phosphor fabricated by this method, the fluorescence is generated by the interfaces between the thin film 102 and the zinc oxide micro/nano structure 110. Therefore, the illuminated model depends on the size and number of the interfaces between the thin film 102 and the zinc oxide micro/nano structure 110. If the size and number of the interfaces between the thin film 102 and the zinc oxide micro/nano structure 110 are changed, the illuminated model will be changed. The color temperature coordinate of the white LED composed of the LED phosphor under excitation of the purple light is also changed when the size and number of the interfaces between the thin film 102 and the zinc oxide micro/nano structure 110 are changed. The size and number of the interfaces between the thin film 102 and the zinc oxide micro/nano structure 110 depend on the geometric size and the geometric shape of the zinc oxide micro/nano structure. In other words, the color temperature coordinate of the white LED composed of the LED phosphor under excitation of the purple light can be changed by changing the geometric size and the geometric shape of the zinc oxide micro/nano structure.

Moreover, in the fabricating method of the LED phosphor illustrated in FIG. 1A to FIG. 1E, the organic material and the zinc oxide, which are cheap, easy to be obtained, and environmentally friendly, is used instead of the rare earth elements, which are expensive and are not environmentally friendly, to be the raw material of the phosphor. Furthermore, comparing with solid-state sintering for fabricating the conventional LED phosphor, the processes for fabricating the organic thin film and the zinc oxide micro/nano structure have advantages of simple process, simple processing conditions (or requirements) and low cost. Therefore, the cost of fabricating the LED phosphor can be decreased substantially and the process for fabricating the LED phosphor can be simplified substantially. Accordingly, the cost of producing a white LED can be decreased substantially and the process of producing a white LED can be substantially simplified by using this LED phosphor.

Figure 2A:
FIG. 2A and FIG. 2B are a series of cross-section drawings illustrating a fabricating method of a LED phosphor in accordance with another embodiment of the present invention.
Figure 2B:
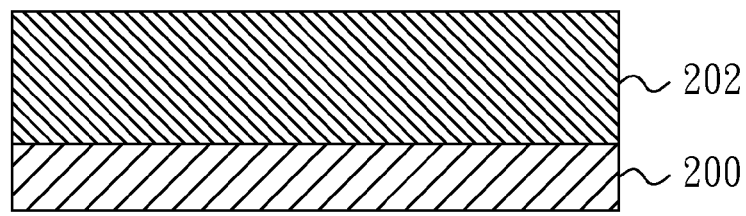

FIG. 2A to FIG. 2B show a fabricating method of a LED phosphor in accordance with another embodiment of the present invention, and they are a series of cross-section drawings illustrating the process of this method and different steps of this method. First, referring to FIG. 2A, a substrate 200 is provided wherein the substrate 200 is a glass substrate, an epoxy substrate, a quartz substrate, a PET substrate, or a substrate which does not react with an organic thin film (or organic material). After, the substrate 200 is washed respectively by deionized water, acetone, methanol, and isopropanol, and then, the substrate 200 is dried by blowing with a nitrogen spray gun. After, a UV-Ozone treatment is performed to the substrate 200 for removing the organic materials on the substrate 200. Therefore, the surface of the substrate 200 becomes a super-clean surface by this treatment. The number of times of washing the substrate 200, the time of washing the substrate 200, and the time of performing UV-Ozone treatment to the substrate 200 can be reduced or increased according to requirements so they are not limited herein in this invention.

And then, referring to FIG. 2B, a photoluminescence thin film 202 is formed on the substrate 200 wherein the photoluminescence thin film 202 comprises a blue light organic material and a zinc oxide micro/nano structure. The photoluminescence thin film 202 is a single-layered structure composed of the blue light organic material and the zinc oxide micro/nano structure. The blue light organic material is poly(9,9-DI-N-hexylfluorenyl-2,7-diyl)(PF), Alq2, Aromatic oligomer containing pyramidine, Fluorene Oligomers, Aromatic oligomer containing furan, distearyl allylene (DSA), stilbenes, or coumarins.

The process for forming the photoluminescence thin film 202 on the substrate 200 comprises following steps: First, the blue light organic material is dissolved into a solvent, such as chloroform or other solvent capable of dissolving the blue light organic material, for preparing a solution. After, an oily dispersant, such as phosphonates, is dissolved into the solution wherein the weight ratio of the oily dispersant and the solvent is at 1:10, but not limited to this. The weight ratio of the oily dispersant and the solvent can be increased or decreased according to actual requirements. And then, zinc oxide nanoparticles, for example NPs of Nanostructure & Amorphous Materials INc. or other similar zinc oxide nanoparticles, are mixed into the solution, and the solution is stirred at room temperature for 1 hour to 3 hours for dispersing or distributing the blue light organic material and the zinc oxide nanoparticles in the solution uniformly. The diameters of the zinc oxide nanoparticles are 1 nm to 1000 nm. The zinc oxide nanoparticles are zinc oxide nanoparticles having regular shapes or zinc oxide nanoparticles having irregular shapes. After, the solution is coated on the substrate 200 by spin coating, dip coating, ink printing, thermal evaporation, sputtering, spray coating, or roll-to-roll. And then, the solution coated on the substrate 200 is baked to form the photoluminescence thin film 202. The thickness of photoluminescence thin film 202 is 10 nm to 1 nm.

In the LED phosphor fabricated by the method illustrated in FIG. 2A to FIG. 2B, the photoluminescence thin film 202 is a single-layered structure composed of the blue light organic material and many zinc oxide nanoparticles. In the photoluminescence thin film 202, there are many interfaces between the blue light organic material and zinc oxide nanoparticles, which are generated by contact of the blue light organic material and the zinc oxide nanoparticles. These interfaces have many hole traps therein. Therefore, a lot of energy levels are generated in these interfaces (the principles of these effects are detailed before, so they are not mentioned again). By these energy levels, the LED phosphor can be excited by a purple light (with wavelength of 300 nm to 390 nm) to emit a yellow-green light (with wavelength of 500 nm to 600 nm). Furthermore, the LED phosphor also can be excited by the purple light to emit a blue light because the photoluminescence thin film 202 comprises the blue light organic material. Therefore, the LED phosphor fabricated by the method illustrated in FIG. 2A to FIG. 2B is a phosphor which is excited by the purple light to emit the yellow-green light and the blue light simultaneously, and the yellow-green light can be mixed with the blue light to form a white light. Accordingly, a white LED can be formed by directly integrating the LED phosphor with a purple LED. As the principles mentioned above, the color temperature coordinate of the white LED composed of the LED phosphor under excitation of the purple light also can be changed by changing the geometric sizes and the geometric shapes of the zinc oxide nanoparticles (or structures). Moreover, a red light (fluorescence) organic material can be added into the (blue light) organic material of the photoluminescence thin film 202, and the color temperature of the white LED, which is formed by this LED phosphor, can be adjusted by changing the ratio of the red light (fluorescence) organic material added into the (blue light) organic material. It means that the ratio of the red light (fluorescence) organic material added into the (blue light) organic material can be adjusted according to desired color temperature of the white light. The red light (fluorescence) organic material is Poly(3-hexylthiophene) (P3HT), polycyclic aromatic hydrocarbon (PAH), 4-(dicyanomethylene)-2-methyl-6-[4-(dimethylaminostyryl)-4H-pyran] (DCM) and derivatives thereof, or 5,10,15,20-teraphenylporphyrin (TPP) and derivatives thereof.

Moreover, in the fabricating method of the LED phosphor illustrated in FIG. 2A to FIG. 2B, the blue light organic material and the zinc oxide nanoparticles (or microparticles), which are cheap, easy to be obtained, and environmentally friendly, is used instead of the rare earth elements, which are expensive and are not environmentally friendly, to be the raw material of the phosphor. Furthermore, comparing with solid-state sintering for fabricating the conventional LED phosphor, the process for fabricating the photoluminescence thin film composed of the blue light organic material and the zinc oxide nanoparticles (or microparticles) has advantages of simple process, simple processing conditions (or requirements) and low cost. Therefore, the cost of fabricating the LED phosphor can be decreased substantially and the process for fabricating the LED phosphor can be simplified substantially. Accordingly, the cost of producing a white LED can be decreased substantially and the process of producing a white LED can be substantially simplified by using this LED phosphor.

Figure 3A:
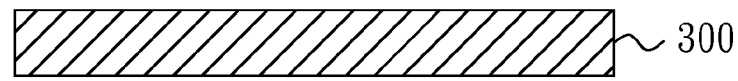
FIG. 3A to FIG. 3C are a series of cross-section drawings illustrating a fabricating method of a LED phosphor in accordance with still another embodiment of the present invention.
Figure 3B:
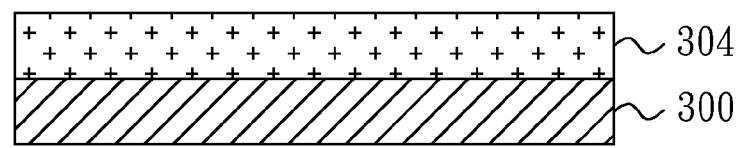
Figure 3C:
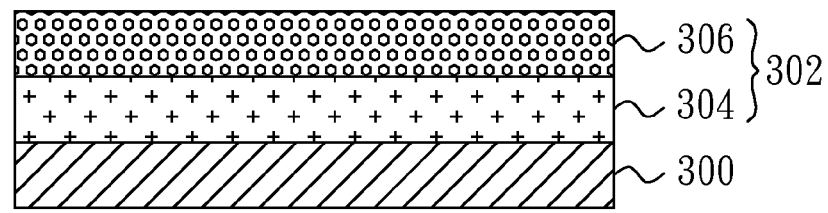

FIG. 3A to FIG. 3C show a fabricating method of a LED phosphor in accordance with still another embodiment of the present invention, and they are a series of cross-section drawings illustrating the process of this method and different steps of this method. First, referring to FIG. 3A, a substrate 300 is provided wherein the substrate 300 is a glass substrate, an epoxy substrate, a quartz substrate, a PET substrate, or a substrate which does not react with an organic thin film (or organic material). After, the substrate 300 is washed respectively by deionized water, acetone, methanol, and isopropanol, and then, the substrate 300 is dried by blowing with a nitrogen spray gun. After, a UV-Ozone treatment is performed to the substrate 300 for removing the organic materials on the substrate 300. Therefore, the surface of the substrate 300 becomes a super-clean surface by this treatment. The number of times of washing the substrate 300, the time of washing the substrate 300, and the time of performing UV-Ozone treatment to the substrate 300 can be reduced or increased according to requirements so they are not limited herein in this invention.

Next, referring to FIG. 3B, a zinc oxide micro/nano structure 304 is formed on the substrate 300 by hydrothermal method, spin coating, dip coating, electrochemical method, thermal evaporation, chemical vapor deposition, molecular beam epitaxy, or AAO. This step can be performed by the steps illustrated in FIG. 1D and FIG. 1E. In this step, a zinc oxide thin film is formed on the substrate 300 to be a seed layer first, and then, the zinc oxide micro/nano structure 304 is formed or grown on the substrate 300 by above-mentioned methods. The steps illustrated in FIG. 1D and FIG. 1E are detailed before so they are not mentioned again.

Finally, referring to FIG. 3C, a blue light organic material is coated on the zinc oxide micro/nano structure 304 by spin coating, dip coating, ink printing, thermal evaporation, sputtering, spray coating, or roll-to-roll to form a thin film 306 of the blue light organic material on the zinc oxide micro/nano structure 304. The thin film 306 of the blue light organic material and the zinc oxide micro/nano structure 304 constructs a photoluminescence thin film 302. Therefore, the photoluminescence thin film 302 is a two-layered (or multi-layered) structure. The thickness of the photoluminescence thin film 302 is 10 nm to 1 mm.

The zinc oxide micro/nano structure 304 is a regular micro/nano structure or an irregular micro/nano structure. The zinc oxide micro/nano structure 304 is a zinc oxide micro/nano rod, a zinc oxide micro/nano line, or a zinc oxide micro/nano particle.

The LED phosphor fabricated by the method illustrated in FIG. 3A to FIG. 3C and the LED phosphor fabricated by the method illustrated in FIG. 2A to FIG. 2B have similar structure. Both of them are composed of a substrate 200, 300 and a photoluminescence thin film 202, 302. However, the difference between them is that the photoluminescence thin film 302 is a multi-layered (or two layered) structure composed of the thin film 306 of the blue light organic material and the zinc oxide micro/nano structure 304 and the photoluminescence thin film 202 is a single-layered structure composed of the blue light organic material and the zinc oxide nanoparticles (or microparticles). Similar to the photoluminescence thin film 202, the photoluminescence thin film 302 also has many interfaces between the thin film 306 of the blue light organic material and the zinc oxide micro/nano structure 304, which are generated by contact of the thin film 306 of the blue light organic material and the zinc oxide micro/nano structure 304. Therefore, the LED phosphor (or the photoluminescence thin film 302) also can be excited by a purple light to emit yellow-green light. The LED phosphor (or the photoluminescence thin film 302) also can be excited by a purple light to emit blue light because the photoluminescence thin film 302 comprises the blue light organic material (the thin film 306 of the blue light organic material). In other words, the LED phosphor, which is fabricated by the method illustrated in FIG. 3A to FIG. 3C, is a LED phosphor capable of simultaneously emitting a yellow-green light and a blue light by excitation of a purple light. A white light is formed by mixing the yellow-green light with the blue light. Therefore, a white LED CaO be fabricated directly by integrating the LED phosphor with a purple LED. As the principles mentioned above, the color temperature coordinate of the white LED composed of the LED phosphor under excitation of the purple light can be changed by changing the geometric size and the geometric shape of the zinc oxide micro/nano structure. Moreover, a red light (fluorescence) organic material can be added into the (blue light) organic material of the photoluminescence thin film 302, and the color temperature of the white LED, which is formed by this LED phosphor, can be adjusted by changing the ratio of the red light (fluorescence) organic material added into the (blue light) organic material. It means that the ratio of the red light (fluorescence) organic material added into the (blue light) organic material CaO be adjusted according to desired color temperature of the white light. The red light (fluorescence) organic material is Poly(3-hexylthiophene) (P3HT), polycyclic aromatic hydrocarbon (PAH), 4-(dicyanomethylene)-2-methyl-6-[4-(dimethylaminostyryl)-4H-pyran](DCM) and derivatives thereof, or 5,10,15,20-teraphenylporphyrin (TPP) and derivatives thereof.

Moreover, in the fabricating method of the LED phosphor illustrated in FIG. 3A to FIG. 3C, the blue light organic material and the zinc oxide micro/nano structure, which are cheap, easy to be obtained, and environmentally friendly, is used instead of the rare earth elements, which are expensive and are not environmentally friendly, to be the raw material of the phosphor. Furthermore, comparing with solid-state sintering for fabricating the conventional LED phosphor, the process for fabricating the photoluminescence thin film composed of the blue light organic material and the zinc oxide micro/nano structure has advantages of simple process, simple processing conditions (or requirements) and low cost. Therefore, the cost of fabricating the LED phosphor can be decreased substantially and the process for fabricating the LED phosphor can be simplified substantially. Accordingly, the cost of producing a white LED can be decreased substantially and the process of producing a white LED can be substantially simplified by using this LED phosphor.

The present invention further provides a LED phosphor. The LED phosphor comprises a substrate and a photoluminescence thin film deposed on the substrate wherein the photoluminescence thin film comprises an organic material and a zinc oxide micro/nano structure. The substrate is a glass substrate, an epoxy substrate, a quartz substrate, a PET substrate, or a substrate which does not react with the organic thin film (or organic material).

The LED phosphor may be the LED phosphor illustrated in FIG. 1E. The photoluminescence thin film of this LED phosphor is a multi-layered structure composed of the organic thin film 102, the zinc oxide thin film 108 and the zinc oxide micro/nano structure 110. It is a LED phosphor which can emit a yellow-green light by excitation of a purple light. In this LED phosphor, a surface bond scission treatment is performed to the surface of the organic material (it means the organic thin film 102), which contacts the zinc oxide micro/nano structure 110 (or the zinc oxide thin film 108) or is bound to the zinc oxide micro/nano structure 110 (or the zinc oxide thin film 108). The structure, composition, fabricating method, and materials employed to form each layer of the LED phosphor illustrated in FIG. 1E are detailed before so they are not mentioned herein again.

Next, the LED phosphor may be the LED phosphor illustrated in FIG. 2B. The photoluminescence thin film 202 of this LED phosphor is a single-layered structure composed of the blue light organic material and the zinc oxide nanoparticles (or microparticles). It is a LED phosphor which can emit a yellow-green light and a blue light simultaneously by excitation of a purple light. A white light can be generated by mixing the yellow-green light and the blue light. The structure, composition, fabricating method, and materials employed to form each layer of the LED phosphor illustrated in FIG. 2B are detailed before so they are not mentioned herein again.

Furthermore, the LED phosphor may be the LED phosphor illustrated in FIG. 3C. The photoluminescence thin film 302 of this LED phosphor is a multi-layered (or two-layered) structure composed of the zinc oxide micro/nano structure 304 formed on the substrate 300 and the thin film 306 made of the blue light organic material (or the blue light organic material itself) coated on the zinc oxide micro/nano structure. It is a LED phosphor which can emit a yellow-green light and a blue light simultaneously by excitation of a purple light. A white light can be generated by mixing the yellow-green light and the blue light. The structure, composition, fabricating method, and materials employed to form each layer of the LED phosphor illustrated in FIG. 3C are detailed before so they are not mentioned herein again.

Furthermore, a red light (fluorescence) organic material can be added into the (blue light) organic material of the photoluminescence thin films of foregoing LED phosphors, and the color temperature of a white LED, which is formed by this LED phosphor, can be adjusted by changing the ratio of the red light (fluorescence) organic material added into the (blue light) organic material. It means that the ratio of the red light (fluorescence) organic material added into the (blue light) organic material can be adjusted according to desired color temperature of the white light. The red light (fluorescence) organic material is Poly(3-hexylthiophene) (P3HT), polycyclic aromatic hydrocarbon (PAH), 4-(dicyanomethylene)-2-methyl-6-[4-(dimethylaminostyryl)-4H-pyran] (DCM) and derivatives thereof, or 5,10,15,20-teraphenylporphyrin (TPP) and derivatives thereof.

According to foregoing embodiments, a fabricating method of a LED phosphor is provided in this invention. In this fabricating method, organic material and zinc oxide, which are cheaper, easier to be obtained, and more environmentally friendly, is used as the raw material of the phosphor, and the process having advantages of simple process, simple processing conditions (or requirements) and low cost is applied instead of the conventional solid-state sintering having a need of high cost, long processing time, and high temperature for fabricating the LED phosphor to fabricate the LED phosphor. Therefore, the cost of fabricating the LED phosphor can be decreased and the process for fabricating the LED phosphor can be simplified. Furthermore, a LED phosphor, which is cheap, easy to be fabricated, and formed without any rare earth elements is also provided in this invention. Accordingly, the cost of producing a white LED can be substantially decreased and the process of producing a white LED can be substantially simplified by using this LED phosphor.

The above disclosure and referenced items, and that described on the referenced pages, are intended to be operable or modifiable to be operable, in whole or in part, with corresponding or related structure and methods, in whole or in part, described in the following publication and items referenced therein, which is listed as follows: "ZnO Nanorods on PMMA for White-Light Emission Using UV-Ozone Treatment" (Lin et al., International Conference on Nanoscience+Technology 2012, Meeting No. 296, Paris, France, Jul. 23-27, 2012). All of the contents of the preceding publication are incorporated herein by reference in its entirety.

What is claimed is:

1. A fabricating method of a LED (light-emitting diode) phosphor, comprising:
   (1) providing a substrate;
   (2) forming a thin film on said substrate;
   (3) performing a surface bond scission treatment to said thin film for breaking chemical bondings of said thin film to form many charged functional groups or hydrophilic functional groups on said surface of said thin film; and
   (4) forming a zinc oxide micro/nano structure on said thin film.

2. The method of claim 1, wherein said substrate is a glass substrate, an epoxy substrate, a quartz substrate, a PET substrate, or a substrate which does not react with said thin film.

3. The method of claim 1, wherein in said thin film is made of gallium nitride (GaN), zinc oxide (ZnO), poly(3-hexylthiophene) (P3HT), poly(3-octylthiophene) (P3OT), poly(N-vinylcarbazole) (PVK), poly(methyl methacrylate) (PMMA), or poly(styrene).

4. The method of claim 1, wherein said step (2) is performed to form said thin film on said substrate by spin coating, dip coating, ink printing, thermal evaporation, sputtering, spray coating, or roll-to-roll.

5. The method of claim 1, wherein thickness of said thin film is 10 nm to 200 μm.

6. The method of claim 1, wherein in said step (3), said surface bond scission treatment is performed by using a plasma treatment or a UV-Ozone treatment to the surface of said thin film.

7. The method of claim 1, wherein process time of said step (3) is 30 seconds to 5 hours.

8. The method of claim 7, wherein the process time of said step (3) is 10 minutes to 60 minutes.

9. The method of claim 1, wherein said step (4) comprises:
   forming a zinc oxide thin film on said thin film as a seed layer; and
   forming said zinc oxide micro/nano structure on said zinc oxide thin film.

10. The method of claim 9, wherein said step of forming a zinc oxide thin film on said thin film as a seed layer is performed to form said zinc oxide thin film by solution method.

11. The method of claim 10, wherein in said step of forming said zinc oxide micro/nano structure on said zinc oxide thin film, isopropanol is used as a solvent to mix monoethanolamine and zinc acetate for preparing a chemical solution, and said solution method is performed by said chemical solution.

12. The method of claim 11, wherein said chemical solution is coated on said thin film by spin coating.

13. The method of claim 9, wherein said step of forming said zinc oxide micro/nano structure on said zinc oxide thin film is performed by hydrothermal method, spin coating, dip coating, electrochemical method, thermal evaporation, chemical vapor deposition, molecular beam epitaxy, or AAO for forming said zinc oxide micro/nano structure on said zinc oxide thin film.

14. The method of claim 13, wherein in said step of forming said zinc oxide micro/nano structure on said zinc oxide thin film, a zinc nitrate/hexamethylenetetramine aqueous solution or a mixed aqueous solution, in which zinc oxide is precipitated through chemical reaction, is used as a chemical solution of hydrothermal method and said zinc oxide micro/nano structure is formed on said zinc oxide thin film by said hydrothermal method.

15. The method of claim 14, wherein said step of forming said zinc oxide micro/nano structure on said zinc oxide thin film is performed at 60° C. to 120° C.

16. The method of claim 14, wherein concentration of said chemical solution is 50 mM to 220 mM.

17. The method of claim 1, wherein said zinc oxide micro/nano structure is a regular micro/nano structure or an irregular micro/nano structure.

18. The method of claim 1, wherein said zinc oxide micro/nano structure is a zinc oxide micro/nano rod.

19. The method of claim 18, wherein length of said zinc oxide micro/nano rod is 10 nm to 220 μm.

20. The method of claim 1, wherein a white light is generated by employing said LED (light-emitting diode) phosphor with a purple LED and a blue LED.

21. The method of claim 1, wherein said LED (light-emitting diode) phosphor is excited by said purple LED to emit a yellow-green light and said yellow-green light is mixed with a blue light emitted by said blue LED to generate said white light.

22. A LED (light-emitting diode) phosphor, comprising:
   a substrate; and
   a photoluminescence thin film deposed on said substrate wherein said photoluminescence thin film comprises an organic material and a zinc oxide micro/nano structure, and said organic material has a surface having many charged functional groups or hydrophilic functional groups through a bond scission treatment.

23. The LED (light-emitting diode) phosphor of claim 22, wherein said substrate is a glass substrate, an epoxy substrate, a quartz substrate, a PET substrate, or a substrate which does not react with said thin film.

24. The LED (light-emitting diode) phosphor of claim 22, wherein said photoluminescence thin film is a multi-layered structure compose of a layer of said organic material and a layer of said zinc oxide micro/nano structure.

25. The LED (light-emitting diode) phosphor of claim 24, wherein said organic material is gallium nitride (GaN), zinc oxide (ZnO), poly(3-hexylthiophene) (P3HT), poly(3-octylthiophene) (P3OT), poly(N-vinylcarbazole) (PVK), poly(methyl methacrylate) (PMMA), or poly(styrene).

26. The LED (light-emitting diode) phosphor of claim 25, wherein a surface bond scission treatment is performed to surface of said organic material bound to said zinc oxide micro/nano structure.

27. The LED (light-emitting diode) phosphor of claim 26, wherein said LED (light-emitting diode) phosphor is excited by a purple light to emit a yellow-green light.

28. The LED (light-emitting diode) phosphor of claim 24, wherein said organic material is a blue light organic material.

29. The LED (light-emitting diode) phosphor of claim 28, wherein said blue light organic material is poly(9,9-DI-N-hexylfluorenyl-2,7-diyl)(PF), Alq2, Aromatic oligomer containing pyramidine, Fluorene Oligomers, Aromatic oligomer containing furan, distearyl allylene (DSA), stilbenes, or coumarins.

30. The LED (light-emitting diode) phosphor of claim 29, wherein said blue light organic material is coated on said zinc oxide micro/nano structure.

31. The LED (light-emitting diode) phosphor of claim 30, wherein said LED (light-emitting diode) phosphor is excited by a purple light to emit a yellow-green light and a blue light, and said yellow-green light is mixed with said blue light to generate said white light.

32. The LED (light-emitting diode) phosphor of claim 22, wherein said photoluminescence thin film is a single-layered structure compose of said organic material and said zinc oxide micro/nano structure.

33. The LED (light-emitting diode) phosphor of claim 32, wherein said organic material is a blue light organic material.

34. The LED (light-emitting diode) phosphor of claim 33, wherein said blue light organic material is poly(9,9-DI-N-hexylfluorenyl-2,7-diyl)(PF), Alq2, Aromatic oligomer containing pyramidine, Fluorene Oligomers, Aromatic oligomer containing furan, distearyl allylene (DSA), stilbenes, or coumarins.

35. The LED (light-emitting diode) phosphor of claim 33, wherein said LED (light-emitting diode) phosphor is excited by a purple light to emit a yellow-green light and a blue light, and said yellow-green light is mixed with said blue light to generate said white light.

36. The LED (light-emitting diode) phosphor of claim 22, further comprising a red light organic material added into said organic material of said photoluminescence thin film wherein said red light organic material is Poly(3-hexylthiophene) (P3HT), polycyclic aromatic hydrocarbon (PAH), 4-(dicyanomethylene)-2-methyl-6-[4-(dimethylaminostyryl)-4H-pyran](DCM) and derivatives thereof, or 5,10,15,20-teraphenylporphyrin (TPP) and derivatives thereof, and ratio of said red light organic material is adjusted according to a desired color temperature coordinate.

37. The LED (light-emitting diode) phosphor of claim 22, wherein said zinc oxide micro/nano structure is a regular micro/nano structure or an irregular micro/nano structure.

38. The LED (light-emitting diode) phosphor of claim 22, wherein said zinc oxide micro/nano structure is a zinc oxide micro/nano rod, a zinc oxide micro/nano line, or a zinc oxide micro/nano particle.

\* \* \* \* \*